United States Patent
Komatsu et al.

(10) Patent No.: US 11,505,717 B2
(45) Date of Patent: Nov. 22, 2022

(54) NANOBUBBLE-CONTAINING INORGANIC OXIDE FINE PARTICLE AND ABRASIVE CONTAINING SAME

(71) Applicant: JGC CATALYSTS AND CHEMICALS LTD., Kanagawa (JP)

(72) Inventors: Michio Komatsu, Fukuoka (JP); Hiroyasu Nishida, Fukuoka (JP); Kazuhiro Nakayama, Fukuoka (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 240 days.

(21) Appl. No.: 16/617,582

(22) PCT Filed: May 21, 2018

(86) PCT No.: PCT/JP2018/019548
§ 371 (c)(1),
(2) Date: Nov. 27, 2019

(87) PCT Pub. No.: WO2018/221304
PCT Pub. Date: Dec. 6, 2018

(65) Prior Publication Data
US 2020/0109312 A1      Apr. 9, 2020

(30) Foreign Application Priority Data

Jun. 1, 2017 (JP) .............................. JP2017-109447

(51) Int. Cl.
*C09G 1/02*       (2006.01)
*C09K 3/14*       (2006.01)
*H01L 21/306*     (2006.01)

(52) U.S. Cl.
CPC .............. *C09G 1/02* (2013.01); *C09K 3/1409* (2013.01); *H01L 21/30625* (2013.01)

(58) Field of Classification Search
CPC ....... B24B 37/00; C01B 33/18; C01F 17/235; C01P 2004/51; C01P 2004/62;
(Continued)

(56) References Cited

U.S. PATENT DOCUMENTS 9,431,262 B2      8/2016  Shibuya et al.
10,032,644 B2 *   7/2018  Shi ....................... C09K 3/1463
(Continued)

FOREIGN PATENT DOCUMENTS

CN     105176406 A     12/2015
JP     2007-61989 A     3/2007
(Continued)

OTHER PUBLICATIONS

Extended European Search Report dated Jan. 26, 2021 for European Patent Application EP18809716.
(Continued)

*Primary Examiner* — Shuangyi Abu Ali
(74) *Attorney, Agent, or Firm* — Troutman Pepper Hamilton Sanders LLP (57) ABSTRACT

An object of the present invention is to provide a nanobubble-containing inorganic oxide fine particle dispersion having excellent concentration stability in a process used as an abrasive. The object is achieved by the nanobubble-containing inorganic oxide fine particle dispersion including: inorganic oxide fine particles having an average particle size of 1 to 500 nm and containing fine particles containing Ce; and nanobubbles having an average cell size of 50 to 500 nm and being at least one non-oxidizing gas selected from a group consisting of $N_2$ and $H_2$.

10 Claims, 3 Drawing Sheets

(58) Field of Classification Search
CPC .... C01P 2004/64; C01P 2006/40; C09G 1/02; C09K 3/1409; C09K 3/1436; C09K 3/1463; H01L 21/304; H01L 21/30625
See application file for complete search history.

(56) References Cited

U.S. PATENT DOCUMENTS

| | | |
|---|---|---|
| 10,471,565 B2 | 11/2019 | Shibuya et al. |
| 2008/0227297 A1 | 9/2008 | Matsui et al. |
| 2009/0233444 A1* | 9/2009 | Zhao ................ H01L 21/31053 438/692 |
| 2016/0272860 A1 | 9/2016 | Mizoguchi et al. |

FOREIGN PATENT DOCUMENTS

| | | |
|---|---|---|
| JP | 2009-111095 A | 5/2008 |
| JP | 2008-235357 A | 10/2008 |
| JP | 2009-111094 A | 5/2009 |
| JP | 2009-111095 A | 5/2009 |
| JP | 2009111094 A * | 5/2009 |
| JP | 2010-042338 A | 2/2010 |
| JP | 2011-5584 A | 1/2011 |
| JP | 2011-104694 A | 6/2011 |
| JP | 2013-038237 A1 | 2/2013 |
| JP | 2013-177617 A | 9/2013 |
| JP | 2014-151424 A1 | 8/2014 |
| JP | 2015-109401 A1 | 6/2015 |
| JP | 2015-127987 A1 | 7/2015 |
| JP | 2015-186838 A | 10/2015 |
| JP | 2016092340 A * | 5/2016 |
| JP | 6141482 B1 | 5/2017 |
| JP | 6141482 B1 | 6/2017 |
| JP | 62-55471 B1 | 12/2017 |
| JP | 6255471 B1 | 12/2017 |
| TW | 201544236 A | 12/2015 |
| WO | WO-2005084718 A1 * | 9/2005 .......... B01F 3/04439 |
| WO | 2012018175 A2 | 2/2012 |
| WO | 2014/208414 A1 | 12/2014 |
| WO | 2015-064159 A1 | 5/2015 |
| WO | 2018-216218 A1 | 11/2018 |

OTHER PUBLICATIONS

International Search Report issued in corresponding International Patent Application No. PCT/JP2018/019548 dated Jun. 26, 2018 with English translation).

* cited by examiner

FIG. 3

NANOBUBBLE-CONTAINING INORGANIC OXIDE FINE PARTICLE AND ABRASIVE CONTAINING SAME

CROSS REFERENCE TO RELATED APPLICATIONS

This is a U.S. National Phase application under 35 U.S.C. § 371 of International Patent Application No. PCT/JP2018/019548, filed May 21, 2018, which claims priority of Japanese Patent Application No. 2017-109447, filed Jun. 1, 2017. The entire contents of which are hereby incorporated by reference.

FIELD OF THE INVENTION

The present invention relates to nanobubble-containing inorganic oxide fine particles and abrasive containing the same.

BACKGROUND

In semiconductor devices such as a semiconductor substrate and a wiring substrate, surface states affect semiconductor properties. Therefore, it is required to polish surfaces and end surfaces of these components with extremely high accuracy.

Conventionally, as a polishing method for such a member, a method is adopted in which a relatively rough primary polishing process is performed, and then a precise secondary polishing process is performed, to obtain a smooth surface or a very high precision surface with few scratches.

For example, the following method has been conventionally proposed as the abrasive used for secondary polishing as such final polishing.

Abrasive silica sol proposed in JP-A-2013-177617 is silica sol in which silica fine particles are dispersed in a dispersion medium. In the abrasive silica sol, a mode particle size in particle size distribution of the silica fine particles is in a range of 5 to 100 nm. Furthermore, the abrasive silica sol satisfies the following conditions. 1) Proportion of the silica fine particles exceeding the mode particle size is in the range of 0.1 to 30 vol % to all the silica fine particles, and 2) a particle size variation coefficient in the particle size distribution not more than the mode particle size is in the range of 8 to 70%. And, with such abrasive silica sol, it is described that when it is applied to polishing application, generation of linear marks, scratches or the like is suppressed, and an excellent polishing rate is continuously shown.

SUMMARY

In general, in an inorganic oxide fine particle dispersion in which inorganic oxide fine particles such as silica fine particles are dispersed in a dispersion medium, the dispersion having a higher solid concentration is suitable for transportation work and handling in various processes unless there is a particular problem. Furthermore, when the inorganic oxide fine particle dispersion is applied to the polishing application, the polishing process is often performed in an open system. Thus, when polishing liquid is prepared, foreign matters such as dry matters and microgels due to partial concentration often occurs due to changes in surrounding environment (temperature, humidity or the like), liquid level fluctuation of the polishing liquid due to agitation in a tank, scattered liquid, or the like. Therefore, microfiltration is generally performed in a required process or a final process. Regarding polishing substrates (for example, lithium tantalate, niobium tantalate, sapphire or the like) that require time for polishing, the polishing liquid is recirculated and used as necessary. Due to changes in the surrounding environment, liquid level changes of a circulation tank due to consumption of the polishing liquid, the liquid level fluctuation due to dropping of the polishing liquid from a return line of circulating liquid, and the like, scale generation on a wall surface of the circulation tank, generation of microgels due to concentration of the polishing liquid, generation of agglomerates, and the like often occur. Regarding such a foreign material, a hard and big foreign material can be removed to some extent by microfiltration. However, it is difficult to completely remove particularly soft and fine microgels. It is known that such a polishing process using the inorganic oxide fine particle dispersion containing microgel foreign matters causes scratches (linear marks) on a surface to be polished and deteriorates workability of polishing operation.

Regarding cause of generation of scratches (linear marks) on the surface to be polished and deterioration in workability of the polishing operation due to concentration of the inorganic oxide fine particle dispersion, it is believed that the following facts affect the cause. For example, in the case of a silica fine particle dispersion, the microgels (low molecular silica aggregates, or the like) contained in the silica fine particle dispersion are further aggregated by concentration, or the microgels and the silica fine particles aggregate, so that agglomerates of a size that can be the cause of scratch generation and deterioration in workability occur.

Such a phenomenon is not limited to the silica sol, but occurs in the same manner for the abrasive used for normal polishing such as ceria sol, alumina sol, titania sol, and composite fine particles thereof.

Furthermore, in not only the silica fine particle dispersion but also the inorganic oxide fine particle dispersion, even in its preparation process and polishing process, non-precipitation fine particles or microgels are often generated due to changes in the surrounding environment (temperature, humidity or the like), liquid level fluctuation of the polishing liquid due to agitation in the tank, the scattered liquid, or the like. When the inorganic oxide fine particle dispersion is applied to the polishing application, it has been known that the non-precipitation fine particles or microgels are further aggregated into coarse particles, and filterability is likely to be deteriorated in a filtering process performed before the inorganic oxide fine particle dispersion is used for the polishing application.

The present invention has been intensively studied to solve the above problems. It has been found that a nanobubble-containing inorganic oxide fine particle dispersion and an abrasive containing the same, which are capable of solving the above-described problems, can be obtained, by adding nanobubbles under specific conditions to an inorganic oxide fine particle dispersion containing fine particles containing Ce, such as ceria sol, calcined ceria, silica ceria composite sol, ceria alumina composite sol, or ceria titania composite sol, and by mixing under specific conditions in which the nanobubbles can exhibit their function.

That is, an object of the present invention is to provide the nanobubble-containing inorganic oxide fine particle dispersion having excellent concentration stability in a process used as the abrasive, and the abrasive containing the same.

The present invention improves concentration stability and filterability, by crushing and dispersing by a burst effect of nanobubbles the microgels present in the inorganic oxide fine particle dispersion containing fine particles containing Ce, such as ceria fine particle dispersion, calcined ceria powder-containing dispersion, silica ceria composite fine particle dispersion, ceria alumina composite fine particle dispersion, ceria titania composite fine particle dispersion, to reduce the microgels, so that generation of the coarse particles is suppressed.

The present inventors have intensively studied in order to solve the above problems, and have completed the present invention.

The present invention includes the following (1) to (8).

(1) A nanobubble-containing inorganic oxide fine particle dispersion including:

inorganic oxide fine particles having an average particle size of 1 to 500 nm and containing fine particles containing Ce; and nanobubbles having an average cell size of 50 to 500 nm and being at least one non-oxidizing gas selected from a group consisting of $N_2$ and $H_2$.

(2) The nanobubble-containing inorganic oxide fine particle dispersion according to the above (1), including at least 105 cells/mL nanobubbles.

(3) The nanobubble-containing inorganic oxide fine particle dispersion according to the above (1) or (2), wherein if streaming potential when solid concentration is 0.005 mass % and pH is adjusted to 4.5 is taken as V2 [mV], and if the streaming potential when the nanobubbles are removed, the solid concentration is 0.005 mass %, and the pH is adjusted to 4.5 is taken as V1 [mV], a streaming potential difference $\Delta V = V1-V2$ is at least 10 my.

(4) The nanobubble-containing inorganic oxide fine particle dispersion according to any one of the above (1) to (3), wherein the inorganic oxide fine particles are silica ceria composite fine particles.

(5) The nanobubble-containing inorganic oxide fine particle dispersion according to any one of the above (1) to (4), wherein ceria content in the silica ceria composite fine particles is at least 10 mass %.

(6) The nanobubble-containing inorganic oxide fine particle dispersion according to any one of the above (1) to (5), wherein content of monovalent anions to a total surface area $(4\pi r^2 N)$ obtained from the average cell size (r) and the average number of cells (N) of the nanobubbles, assuming that the nanobubbles are spheres, is less than $8.8 \times 10^{-6}$ mol/m2.

(7) The nanobubble-containing inorganic oxide fine particle dispersion according to any one of the above (1) to (6), wherein content of divalent anions to a total surface area $(4\pi r^2 N)$ obtained from the average cell size (r) and the average number of cells (N) of the nanobubbles, assuming that the nanobubbles are spheres, is less than $4.4 \times 10^{-6}$ mol/m2.

(8) An abrasive including the nanobubble-containing inorganic oxide fine particle dispersion according to any one of the above (1) to (7).

According to the present invention, the following nanobubble-containing inorganic oxide fine particle dispersion and the abrasive containing the same can be provided. The nanobubble-containing inorganic oxide fine particle dispersion is excellent in concentration stability and filterability even when solid content is increased due to concentration or the like in the process used as the abrasive, and deterioration in workability is suppressed.

DETAILED DESCRIPTION

The present invention will be described.

The present invention provides a nanobubble-containing inorganic oxide fine particle dispersion including: inorganic oxide fine particles having an average particle size of 1 to 500 nm and containing fine particles containing Ce; and nanobubbles having an average cell size of 50 to 500 nm and are at least one non-oxidizing gas selected from a group consisting of $N_2$ and $H_2$.

Such a nanobubble-containing inorganic oxide fine particle dispersion is hereinafter also referred to as "the dispersion of the present invention".

In the dispersion liquid of the present invention, first, the inorganic oxide fine particles and the nanobubbles are prepared.

The inorganic oxide fine particles have an average particle size of 1 to 500 nm and are usually dispersed in a solvent.

The average particle size of the inorganic oxide fine particles in the dispersion of the present invention means a value calculated from measurement results by an image analysis method using a transmission electron microscope which will be described in detail in Examples described below.

Here, the inorganic oxide fine particles may be mainly made of ceria fine particles. Or, the inorganic oxide fine particles here contain Ce as an essential component, and preferably contain as main components a composite oxide containing at least one element selected from a group consisting of, for example, Si, Al, B, Mg, Ca, Ba, Mo, Zr, Ga, Be, Sr, Y, La, Ce, Sn, Fe, Zn, Mn, C, H and Ti.

The inorganic oxide fine particles may contain both the ceria fine particles and the composite oxide as the main components, and the inorganic oxide fine particles are preferably substantially made of at least one of them. Note that the inorganic oxide fine particles are a concept including inorganic composite oxide fine particles.

Here, regarding the "main components", the content is preferably at least 50 mass % (that is, a total content of oxides of Si, Al, B, Mg, Ca, Ba, Mo, Zr, Ga, Be, Sr, Y, La, Ce, Sn, Fe, Zn, Mn, C, H, and Ti contained in the inorganic oxide fine particles is preferably at least 50 mass), more preferably at least 60 mass %, more preferably at least 80 mass %, more preferably at least 90 mass %, and even more preferably at least 95 mass %. Furthermore, "substantially" means that impurities mixed in a raw material and the impurities mixed in a production process can be contained. In the following, the terms "main components" and "substantially" are used in this sense unless otherwise specified.

The inorganic oxide fine particles contain Ce. For example, when the inorganic oxide fine particles contain the ceria fine particles (preferably as the main components), oxygen defects are easily reduced. Therefore, in order to avoid this, it is more preferable to use the non-oxidizing gas of $N_2$ or $H_2$ as the nanobubbles.

<Ceria and Non-Oxidizing Gas>

The inorganic oxide fine particles containing Ce are preferably the ceria fine particles or silica ceria composite fine particles. The ceria fine particles or the silica ceria composite fine particles are known to have a specific polishing effect on silica, and show a high polishing rate. Regarding polishing mechanism, it is a common belief that Ce3+ on a surface of tetravalent ceria particles reacts specifically with silica. However, the oxygen defects are easily reduced in $Ce^{3+}$ by an oxidizing gas or the like contained in the inorganic oxide fine particle dispersion. In order to avoid this, it is more preferable to use the non-oxidizing gas of $N_2$ or $H_2$ as the nanobubbles.

<Silica Ceria Composite Fine Particles>

The inorganic oxide fine particles containing Ce are desirably the silica ceria composite fine particles. Because Si easily forms an interstitial solid solution to cerium oxide, and as a result of formation of the interstitial solid solution, a crystal structure of the cerium oxide is distorted and the oxygen defects are generated, which promotes the formation of $Ce^{3+}$.

It is preferable to use the non-oxidizing gas as the nanobubbles even when the inorganic oxide fine particles form the interstitial solid solution due to presence of a hetero element and the oxygen defects increase. Such an example includes a case where the inorganic oxide fine particle contains Ce and further contains the hetero element such as Si, C, N, La, Zr or Al.

<Composition>

When the inorganic oxide fine particles are the silica ceria composite fine particles, a content ratio (mass %) of ceria in the silica ceria composite fine particles, that is, ceria/(silica+ceria)×100 is preferably at least 10 mass %, more preferably at least 20 mass %, and most preferably at least 30 mass %. This is because when the ceria mass % is less than 10 mass %, the content of ceria is too low, so that a sufficient polishing effect on silica may not be shown.

The average particle size of the inorganic oxide fine particles is 500 nm or less, preferably 300 nm or less, more preferably 200 nm or less, and even more preferably 100 nm or less. In addition, the average particle size is 1 nm or more, and preferably 5 nm or more.

<Streaming Potential>

When the nanobubble-containing inorganic oxide fine particle dispersion is diluted with distilled water and nitric acid solution, so that solid concentration is 0.005 mass %, and pH is 4.5, streaming potential of the nanobubble-containing inorganic oxide fine particle dispersion is preferably a negative value. This is because when the streaming potential is the negative value, dispersion stability of the nanobubble-containing inorganic oxide fine particle dispersion is improved.

<Delta Streaming Potential>

After removing the nanobubbles from the dispersion of the present invention to obtain the dispersion containing the inorganic oxide fine particles containing Ce, this is diluted with distilled water and nitric acid solution to obtain the dispersion having a solid concentration of 0.005 mass % and pH adjusted to 4.5. The streaming potential of this dispersion is taken as V1. Furthermore, the dispersion containing the inorganic oxide fine particles containing Ce and the nanobubbles (that is, the dispersion of the present invention) is diluted in the same manner to obtain the dispersion having a solid concentration of 0.005 mass % and pH adjusted to 4.5. The streaming potential of this dispersion is taken as V2. In this case, a potential difference $\Delta V$ ($\Delta V=V1-V2$) is desirably 10 mV or more.

Here, the fact that the streaming potential difference $\Delta V$ is 10 mV or more means that the streaming potential of the fine particle dispersion is negatively increased. Usually, the nanobubbles maintain stability by having a negative potential. Particularly in a low pH region, when the inorganic oxide fine particles such as cerium oxide having a positive streaming potential and the nanobubble dispersion are mixed together, a part of the nanobubbles are adsorbed on a surface of the inorganic oxide fine particles, and the surface is covered with the nanobubbles. Therefore, it is estimated that a negative streaming potential is increased. Even when the inorganic oxide fine particles have a negative potential, $\Delta V$ increases when the potential is small. In this case, it is presumed that a part of the nanobubbles covers the surface of the inorganic oxide fine particles by physical adsorption or the like, and the negative potential is increased.

It is desirable that the part of the nanobubbles covers the surface of the inorganic oxide fine particles containing Ce, since the dispersion stability of the inorganic oxide fine particles is improved. Furthermore, since the nanobubbles are the non-oxidizing gas, it is considered that an effect of suppressing oxidation of $Ce^{3+}$ can also be obtained.

The solvent in which such inorganic oxide fine particles can be dispersed is not particularly limited. However, the solvent is preferably water (including ion-exchanged water and pure water).

The nanobubbles are fine bubbles having a cell size of 500 nm or less. The cell size is preferably 400 nm or less, and more preferably 350 nm or less.
In addition, the cell size is preferably 50 nm or more, and more preferably 70 nm or more.

The average cell size and the number of cells of the nanobubbles can be obtained by measuring Brownian motion speed of the bubbles in a liquid by a nanoparticle tracking analysis.

Regarding the kind of gas contained in the nanobubbles, the gas can exhibit an effect of crushing microgels by burst of the nanobubbles, and is at least one selected from the group consisting of $N_2$ and $H_2$. Here, the nanobubbles may be substantially made of at least one selected from the group consisting of $N_2$ and $H_2$, and are allowed to contain other gases such as $O_2$ in an amount considered to be the impurities mixed in the raw material and the impurities mixed in the production process.

The dispersion of the present invention preferably contains at least $1.0 \times 10^5$ cells/mL nanobubbles, more preferably at least $1.1 \times 10^5$ cells/mL nanobubbles, more preferably at least $1.0 \times 10^8$ cells/mL nanobubbles, and even more preferably at least $1.1 \times 10^8$ cells/mL nanobubbles. The number of nanobubbles is preferably $1000 \times 10^8$ cells/mL or less, more preferably $500 \times 10^8$ cells/mL or less, and even more preferably $100 \times 10^8$ cells/mL or less.

A generation method of microbubbles is not particularly limited, but a conventionally known method can be used. Examples of the method include a swirling flow type, a static mixer type, an ejector type, a venturi type, a pressure dissolution type, a pore type, a rotary type, an ultrasonic type, a vapor condensation type, and an electrolysis type.

The dispersion of the present invention can be obtained by mixing the dispersion containing the inorganic oxide fine particles (also referred to as "inorganic oxide fine particle dispersion") as described above and an aqueous solution containing nanobubbles. Furthermore, the dispersion of the present invention can also be obtained by generating the nanobubbles inside the inorganic oxide fine particle dispersion.

The method for generating the nanobubbles inside the inorganic oxide fine particle dispersion is not particularly limited, but the above-described conventionally known methods can be used.

While or after obtaining a solution containing the inorganic oxide fine particle dispersion and the nanobubble aqueous solution, by mixing (preferably for 0.5 hours or more) the solution containing the inorganic oxide fine particle dispersion and the nanobubble aqueous solution while maintaining the solution, for example, at 5 to 80° C., the nanobubble-containing inorganic oxide fine particle dispersion having excellent concentration stability in the process used as abrasive can be obtained.

Temperature at which the solution containing the inorganic oxide fine particle dispersion and the nanobubble aqueous solution is maintained is preferably 5 to 80° C., more preferably 50° C. or less, and even more preferably 30° C. or less.

When the solution containing the inorganic oxide fine particle dispersion and the nanobubble aqueous solution coexists, since the nanobubbles are negatively charged, a negative charge is increased due to interaction with a surface of inorganic particles.

By dissolution of gas component due to the interaction with a negatively charged nanobubble surface, the nanobubbles become small and pressure is increased, so that dissolution rate is accelerated. However, if there are more cations than anions, it is considered that as the nanobubbles become smaller, cation density on the surface increases, a barrier made of cations is formed, the dissolution rate of the gas component is reduced, the dissolution rate of the nanobubble gas is reduced, and disappearance of the nanobubbles is delayed, and as a result, the concentration stability is continued.

Conversely, if the anion increases, a lifetime of the nanobubble is shortened due to reaction with the cations on the nanobubble surface, and the concentration stability deteriorates.

An optimum amount of anions is also related to an amount of cations.

Regarding a required amount of monovalent anions, the content of monovalent anions to a total surface area ($4\pi r^2 N$), which is obtained from the average cell size (r) and the average number of cells (N) contained in the nanobubble-containing inorganic oxide fine particle dispersion (dispersion of the present invention) by assuming that the nanobubbles are spheres, is desirably less than $8.8 \times 10^{-6}$ mol/m$^2$.

Regarding the required amount of divalent anions, the content of divalent anions to the total surface area, which is obtained from the average cell size (r) and the average number of cells (N) contained in the nanobubble-containing inorganic oxide fine particle dispersion (dispersion of the present invention) by assuming that the nanobubbles are spheres, is desirably less than $4.4 \times 10^{-6}$ mol/m$^2$.

The nanobubble aqueous solution is added to and mixed with the inorganic oxide fine particle dispersion. Mixing means is not particularly limited. Mixing by stirring or the like is preferred. The mixing time is not particularly limited. However, it is preferable to mix, for example, for 0.5 hour or more.

The nanobubble-containing inorganic oxide fine particle dispersion obtained in this way can be suitably used as the abrasive used in final polishing (secondary polishing), which is one of processes for manufacturing semiconductor devices such as semiconductor substrates and wiring substrates.

The nanobubble-containing inorganic oxide fine particle dispersion can also be used as the abrasive as it is. Or, the nanobubble-containing inorganic oxide fine particle dispersion may contain one or more selected from the group consisting of, for example, conventionally known polishing accelerators, surfactants, heterocyclic compounds, pH adjusters, and pH buffers as additives. Note that if it is necessary to dilute the nanobubble-containing inorganic oxide fine particle dispersion, for example, when preparing polishing slurry from the nanobubble-containing inorganic oxide fine particle dispersion, the dispersion is desirably diluted by adding water containing nanobubbles.

When polishing the semiconductor device or the like using the abrasive, if an amount of microgels is small and filtration of the abrasive can be completed in a short time, it is preferable because it improves production efficiency. When the nanobubble-containing inorganic oxide fine particle dispersion of the present invention is used as the abrasive, not only a filtration rate of the abrasive is very fast, but also the abrasive is excellent in concentration stability.

The present inventors presume that a reason why the filtration rate is high and the concentration stability is improved as described above is that the microgels are dispersed by shock waves generated when the nanobubbles disappear. When the microgels disappear by being dispersed, the coarse particles are further reduced. Therefore, it is considered that surface accuracy of the surface to be polished is improved (the scratches and the like are reduced). Furthermore, improvement in the polishing rate is also observed.

The present invention is the abrasive containing the dispersion of the present invention as described above.

The nanobubble-containing inorganic oxide fine particle dispersion of the present invention can suppress germination and generation of molds, fungi, algae and the like, and growth of larvae and juvenile forms in the dispersion, and kill them, due to presence of nanobubbles in the dispersion. These organisms of several microns or less should be called nano-organisms. These organisms are difficult to remove mechanically by ordinary filtration or the like, and can easily fly from the air. Therefore, they are killed with chemicals. However, since the chemicals themselves are organic substances, it is inevitable that they remain as contamination sources.

In contrast, the nanobubbles of several microns generally existing in the liquid are known to have effects of fungicide, sterilization, or algicide on molds, fungi, algae or the like which are grown and proliferated in the liquid. When the nanobubbles of several microns are added to the liquid after these microorganisms have proliferated, their proliferation can be stopped, but a large amount of microbial debris remains. Even if the debris is filtered, the proliferation occurs on the debris remaining on a filter surface. Furthermore, since the nanobubbles of several microns have a lifetime of several days or less, they do not have sustainability, and have little effect on the microorganisms after filtration, spores having passed through the filter, and the nano-organisms having flown from the air. Therefore, for example, in semiconductor polishing application, the chemicals added for killing the nano-organisms, or the microbial debris remaining as foreign substances may affect performance of the semiconductor.

On the other hand, when the nanobubbles of several microns or less are added to the inorganic fine particle dispersion before the growth of molds, fungi or algae sufficiently proceeds in the dispersion, the nanobubbles are present for at least several months. Therefore, the microorganisms can be destroyed at a stage of the spores, larvae or juvenile forms before growth. Therefore, since they do not proliferate on the filter surface, the spores, larvae, juvenile forms, and the like do not pass through the filter or the like. In addition to this, even if they fly and mix from the air, their growth is suppressed. Therefore, it is possible to suppress mass generation of molds, fungi and algae, and an influence due to the remaining organic substances derived from the chemicals and organic foreign substances derived from a living body can be reduced. Therefore, for example, when the nanobubble-containing inorganic oxide fine particle dispersion of the present invention is applied to the polishing application of semiconductor precision circuits, occurrence of defects can be suppressed. Therefore, in a method for producing the nanobubble-containing inorganic oxide fine particles of the present invention, as the raw material of the inorganic oxide fine particle dispersion containing fine particles containing Ce, it is preferred to use the dispersion containing the spores or larvae, and molds, fungi and algae at a juvenile stage or an earlier stage.

Destruction mechanism of the spores, larvae or the like caused by the nanobubbles of several microns or less is considered as follows. That is, a phenomenon (hot spot phenomenon) in which the bubbles shrink and collapse due to a self-pressurizing effect over time occurs, and water molecules are destroyed. Free radicals generated in this way break molecular bonds on an outer surface forming the spores, larvae, juvenile forms and the like. Thus, their physiological activities are inhibited.

The terms "larvae" and "juvenile forms" used here are not used as strict terms, but the former is used as a general term for living organisms that perform physiological activities in a previous stage of growth capable of exerting a proliferation function in animal organisms, and the latter is used as the general term in plant organisms.

Regarding the specific polishing effect of Ce on silica, it is the common belief among researchers in academic societies that $Ce^{3+}$ on the surface of tetravalent ceria particles reacts specifically with silica. If this is correct, it is preferred that oxidizing substances is not contained in a ceria-based abrasive dispersion medium. That is, the present invention suppresses substrate residual organic substances in the abrasive dispersion and the polishing slurry by suppressing ceria oxidation and suppressing bioactivity of nano-sized organisms, so that contamination of the substrates of semiconductors and the like can be prevented.

EXAMPLES

The analysis method or measurement method used in Examples and Comparative Examples is described below.

[Average Particle Size of Inorganic Oxide Fine Particles]

The average particle size of the inorganic oxide fine particles was measured by the image analysis method. Specifically, the inorganic oxide fine particle dispersion as a sample was photographed with the transmission electron microscope (H-800, manufactured by Hitachi, Ltd.) at a magnification of 250,000 times to obtain a photographic projection. In the obtained photographic projection, a maximum diameter of the inorganic oxide fine particle is taken as a major axis, its length is measured, and its value is taken as a major diameter (DL). Furthermore, a point that bisects the major axis was determined on the major axis, and two points, at which a straight line intersecting the major axis at the determined point at right angles intersects the outer rim of the fine particle, were obtained. A distance between the two points is measured and taken as a minor diameter (DS). And a simple average value of the minor diameter (DS) and the major diameter (DL) is taken as a particle size of the fine particles. In this manner, the particle sizes of arbitrary 500 fine particles were obtained. An average value thereof was taken as the average particle size of the inorganic oxide fine particles.

[Average Cell Size of Nanobubbles and Number of Nanobubbles]

Regarding the average cell size of nanobubbles and the number of nanobubbles in the nanobubble aqueous solution, the Brownian motion speed of the bubbles in the liquid was measured using a nanoparticle tracking analysis. Specifically, about 20 mL of a measurement sample (the nanobubble-containing inorganic oxide fine particle dispersion) was sucked into a measuring instrument ("NanoSight NS300" manufactured by Malvern Instruments Ltd.), and the average cell size of nanobubbles and the number of nanobubbles were measured by the nanoparticle tracking analysis.

[Method for Measuring Concentration Stability]

The inorganic oxide fine particle dispersion obtained in Examples or Comparative Examples was placed in a 1 L eggplant flask, and this was placed on a rotary evaporator. After setting a bath temperature to 60° C., concentration was performed at a vacuum degree of −740 mmHg. When a gel-like material was observed on an inner wall surface of the eggplant flask, the concentration was stopped, an inorganic oxide sol was recovered, and the solid concentration was measured.

Such an operation was performed immediately after obtaining the inorganic oxide fine particle dispersion in Examples or Comparative Examples, and an obtained value of the solid concentration was taken as an index indicating the initial concentration stability. Furthermore, such an operation was performed 30 days after the inorganic oxide fine particle dispersion was obtained in Examples or Comparative Examples, and the obtained value of the solid concentration was taken as an index indicating the stable concentration after 30 days.

[Method for Measuring Number of Coarse Particles]

Colloidal silica slurry before (or after) filtering the measurement sample with the filter containing a filter aid was injected into the following measuring instrument with a 6 mL syringe, and an amount of coarse particles was measured.

The measuring instrument and measurement conditions are as follows.
Measuring instrument: "AccuSizer 780APS" manufactured by PSS Inc.
Injection loop volume: 1 mL
Flow rate: 60 mL/min
Data collection time: 60 sec
Number of channels: 128

[Method for Measuring Streaming Potential Difference (ΔV)]

200 g (solid content mass 0.01 g) of the inorganic oxide fine particle dispersion obtained in Examples or Comparative Examples in which inorganic oxide fine particle concentration in the dispersion was 0.005 mass % was prepared. While this was stirred, the pH was adjusted to 4.5 with a 0.5% nitric acid solution, and then the potential was measured with a streaming potential meter (AT-610) manufactured by Kyoto Electronics Manufacturing Co., Ltd. This value was taken as V2.

Using the inorganic oxide fine particle dispersion as the raw material and distilled water, the inorganic oxide fine particle dispersion having an inorganic oxide fine particle concentration of 0.005 mass % was obtained. 200 g (solid content mass 0.01 g) of this dispersion was prepared. While this was stirred, the pH was adjusted to 4.5 with the 0.5% nitric acid solution, and then the potential was similarly measured with the streaming potential meter. This value was taken as V1.

A value of the streaming potential difference between V1 and V2 obtained in this way was taken as ΔV (ΔV=V1−V2).

[Quantification of Impurities]

Concentrations of chlorine ion, nitrate ion, and sulfate ion contained in the inorganic oxide fine particle dispersion or the nanobubble-containing inorganic oxide fine particle dispersion were all measured by ion chromatography.

[Quantification of Nanobubbles in Nanobubble-Containing Inorganic Oxide Fine Particle Dispersion]

The nanobubble-containing inorganic oxide fine particle dispersion was filtered through an ultrafiltration membrane (SIP-1013 fraction molecular weight 6000 produced by Asahi Kasei Corporation) to remove the inorganic oxide fine particles. The Brownian motion speed of the bubbles in filtrate was measured using the nanoparticle tracking analysis. Thus, the average cell size and the number of cells of the nanobubbles were determined. Specifically, about 20 mL of the measurement sample (nanobubble-containing inorganic oxide fine particle dispersion) was sucked into the measuring instrument ("NanoSight NS300" manufactured by Malvern Instruments Ltd.), and was measured by the nanoparticle tracking analysis.

[Remaining Ratio of Nanobubbles after 30 Days]

The average cell size of nanobubbles and the number of nanobubbles in the nanobubble aqueous solution were measured by the method described above. The obtained number of nanobubbles was taken as "number of nanobubbles in a raw nanobubble aqueous solution". Next, a predetermined amount of the nanobubble aqueous solution and a predetermined amount of the inorganic oxide fine particle dispersion were mixed to prepare the nanobubble-containing inorganic oxide fine particle dispersion. 2 L of the measurement sample made of the nanobubble-containing inorganic oxide fine particle dispersion was stored at 25° C. for 30 days, and then about 20 mL was sucked therefrom, and after removing the inorganic oxide fine particles in the same manner as described above, the average particle size of nanobubbles and the number of nanobubbles were determined. The number of nanobubbles was taken as "the number of nanobubbles after 30 days".

Then, [number of nanobubbles after 30 days]/[number of nanobubbles in raw nanobubble aqueous solution]×100 was taken as "remaining ratio of nanobubbles after 30 days".

Reference Example 1

500 g of the silica fine particle dispersion (solid concentration: 5 mass %) in which the silica fine particles having an average particle size of 3 nm were dispersed in water was prepared, and the temperature was maintained at 20° C. 500 g of the nanobubble aqueous solution containing $N_2$ of $1.1\times10^8$ cells/mL having an average cell size of 200 nm was added thereto. Then, the mixture was stirred for 1 hour while maintaining the same temperature, to obtain the nanobubble-containing inorganic oxide fine particle dispersion. The obtained nanobubble-containing inorganic oxide fine particle dispersion was concentrated according to the method for measuring the concentration stability, and the concentration stability was evaluated. Table 1 shows processing conditions and the measurement results.

The filtration rate when the obtained nanobubble-containing inorganic oxide fine particle dispersion was filtered through a filtration filter (filter size: 0.5 μm) at a filtration pressure of 1 mPa was 35 g/min. Regarding the nanobubble-containing inorganic oxide fine particle dispersion having passed through the filter, the number of coarse particles having a particle size of 0.51 μm or more was measured using the AccuSizer 780APS manufactured by PSS Inc. As a result, the number was 200,000 pieces/mL.

Reference Example 2

500 g of the silica fine particle dispersion (solid concentration: 40 mass %) in which the silica fine particles having an average particle size of 80 nm were dispersed in water was prepared, and the temperature was maintained at 20° C. 500 g of the nanobubble aqueous solution containing $N_2$ of $1.1\times10^8$ cells/mL having an average cell size of 180 nm was added thereto. Then, after stirring for 2 hours while maintaining the same temperature, the obtained inorganic oxide fine particle dispersion was concentrated according to the method for measuring the concentration stability, and the concentration stability was evaluated. Table 1 shows the processing conditions and the measurement results.

Reference Example 3

500 g of the silica fine particle dispersion (solid concentration: 30 mass %) in which the silica fine particles having an average particle size of 12 nm were dispersed in water was prepared, and the temperature was maintained at 20° C. 500 g of the nanobubble aqueous solution containing $N_2$ of $2.2\times10^8$ cells/mL having an average cell size of 150 nm was added thereto. Then, after stirring for 2 hours while maintaining the same temperature, the obtained inorganic oxide fine particle dispersion was concentrated according to the method for measuring the concentration stability, and the concentration stability was evaluated. Table 1 shows the processing conditions and the measurement results.

Reference Example 4

500 g of the silica fine particle dispersion (solid concentration: 20 mass %) in which the silica fine particles having an average particle size of 5 nm were dispersed in water was prepared, and the temperature was maintained at 20° C. 500 g of the nanobubble aqueous solution containing $N_2$ of $2.0\times10^8$ cells/mL having an average cell size of 293 nm was added thereto. Then, after stirring for 2 hours while maintaining the same temperature, the obtained solution was concentrated in the same manner as in Reference Example 1 according to the method for measuring the concentration stability. Table 1 shows the processing conditions and the results.

Reference Example 5

500 g of the silica fine particle dispersion (solid concentration: 48 mass %) in which the silica fine particles having an average particle size of 250 nm were dispersed in water was prepared, and the temperature was maintained at 5° C. 500 g of the nanobubble aqueous solution containing $N_2$ of $5.0\times10^8$ cells/mL having an average cell size of 80 nm was added thereto. Then, after stirring for 1.5 hours while maintaining the same temperature, the obtained solution was concentrated in the same manner as in Reference Example 1 according to the method for measuring the concentration stability. Table 1 shows the processing conditions and the results.

Comparative Example 1

While the pH of the silica fine particle dispersion (solid concentration: 5 mass %) in which the silica fine particles having an average particle size of 20 nm are dispersed in water was maintained at 9 and the temperature was maintained at 80° C., an aqueous cerium nitrate solution (ceria equivalent concentration: 5 mass %) was added thereto over 5 hours. The silica fine particle dispersion and the aqueous cerium nitrate solution were added thereto so that $SiO_2$/$CeO_2$ mass ratio=50/50 to prepare a silica ceria composite oxide fine particle dispersion ($SiO_2$/$CeO_2$ mass ratio=50/50).

Thereafter, it was concentrated after washing with the ultrafiltration membrane. 500 g of the inorganic oxide fine particle dispersion (solid concentration: 20 mass %, average particle size: 25 nm) made of $SiO_2$/$CeO_2$ was prepared. Then, the nanobubbles containing $O_2$ of $1.0 \times 10^8$ cells/mL having an average cell size of 300 nm were generated in the aqueous solution. The solution after the nanobubbles were generated was 1000 g.

Then, after stirring for 24 hours while maintaining the temperature of the solution at 20° C., the obtained solution was concentrated in the same manner as in Reference Example 1 according to the method for measuring the concentration stability. Table 1 shows the processing conditions and the results.

Reference Example 6

While the pH of the silica fine particle dispersion (solid concentration: 5 mass %) in which the silica fine particles having an average particle size of 17 nm are dispersed in water was maintained at 9 and the temperature was maintained at 80° C., an aqueous zirconium ammonium carbonate solution (zirconia equivalent concentration: 5 mass %) was added thereto over 5 hours. The silica fine particle dispersion and the aqueous zirconium ammonium carbonate solution were added thereto so that $SiO_2$/$ZrO_2$ mass ratio=75/25 to prepare a silica/zirconia composite fine particle dispersion ($SiO_2$/$ZrO_2$ mass ratio=75/25).

Thereafter, it was concentrated after washing with the ultrafiltration membrane. 500 g of the inorganic oxide fine particle dispersion (solid concentration: 20 mass %, average particle size: 20 nm) made of $SiO_2$/$ZrO_2$ was prepared. The temperature was maintained at 10° C., and 500 g of the nanobubble aqueous solution containing $N_2$ of $2.0 \times 10^8$ cells/mL having an average cell size of 70 nm was added thereto. Then, after stirring for 2 hours while maintaining the same temperature, the obtained solution was concentrated in the same manner as in Reference Example 1 according to the method for measuring the concentration stability. Table 1 shows the processing conditions and the results.

Example 1

500 g of the ceria fine particle dispersion (solid concentration: 20 mass %) in which the ceria fine particles having an average particle size of 20 nm were dispersed in water was prepared, and the temperature was maintained at 30° C. 500 g of the nanobubble aqueous solution containing $N_2$ of $15 \times 10^8$ cells/mL having an average cell size of 290 nm was added thereto. Then, after stirring for 60 hours while maintaining the temperature at 30° C., the obtained nanobubble-containing inorganic oxide fine particle dispersion was concentrated according to the method for measuring the concentration stability, and the concentration stability was evaluated. Table 1 shows the processing conditions and the measurement results.

Table 1 also shows the streaming potential (V1) [−50 mV] of the ceria fine particle dispersion, the streaming potential (V2) [−110 mV] of the nanobubble-containing ceria fine particle dispersion, measured according to the "method for measuring streaming potential difference (ΔV)", and the streaming potential difference (ΔV) [60 mV] obtained from V1 and V2.

Concentration of impurities contained in the obtained nanobubble-containing inorganic oxide fine particle dispersion was measured according to the method described in the "quantification of impurities". Furthermore, the nanobubble-containing inorganic oxide fine particle dispersion according to Example 1 in which the inorganic oxide fine particles (ceria fine particles) and the nanobubbles coexist was filtered through the ultrafiltration membrane (SIP-1013 fraction molecular weight 6000 produced by Asahi Kasei Corporation) to remove the inorganic oxide fine particles (ceria fine particles). As a result of measuring the average cell size and the number of cells of the nanobubbles in the filtrate, 290 nm and 1.38 billion cells/mL were obtained. The remaining ratio of nanobubbles after 30 days was 92%. Table 1 shows the processing conditions and the measurement results.

Regarding these items, the same data was also measured about Example 2 and the followings. The measurement results are shown in Table 1.

Regarding 500 g of the nanobubble-containing ceria fine particle dispersion (solid concentration: 20 mass %), the streaming potential (V2) of which was measured, 5,000 g of distilled water was added thereto while maintaining the volume constant, using the ultrafiltration membrane (fraction molecular weight 5,000 as a pore size), and solvent substitution was performed to remove the nanobubbles, so that 500 g of the ceria fine particle dispersion (solid concentration: 20 mass %) containing no nanobubbles was obtained. For the ceria fine particle dispersion, the streaming potential (V1) was measured again using the streaming potential meter. As a result, −50 mV was obtained at pH 4.5.

This means that the streaming potential (V1) of any of the nanobubble-containing inorganic oxide fine particle dispersion from which only nanobubbles have been removed can be determined, and that this V1, the streaming potential (V2) of the nanobubble-containing ceria fine particle dispersion, and the streaming potential difference (ΔV) obtained from V1 and V2 can be determined.

Example 2

500 g of the ceria fine particle dispersion (solid concentration: 20 mass %) in which the ceria fine particles having an average particle size of 10 nm were dispersed in water was prepared, and the temperature was maintained at 30° C. 500 g of the nanobubble aqueous solution containing $N_2$ of $15 \times 10^8$ cells/mL having an average cell size of 90 nm was added thereto. Then, after stirring for 40 hours while maintaining the temperature at 30° C., the obtained nanobubble-containing inorganic oxide fine particle dispersion was concentrated according to the method for measuring the concentration stability, and the concentration stability was evaluated. Furthermore, as in Example 1, the remaining ratio of nanobubbles was obtained, and the quantification of impurities and the like were also performed. Table 1 shows the processing conditions and the measurement results.

Example 3

500 g of the ceria fine particle dispersion (solid concentration: 10 mass %) in which the ceria fine particles having an average particle size of 5 nm were dispersed in water was prepared, and the temperature was maintained at 30° C. 500 g of the nanobubble aqueous solution containing $H_2$ of $10 \times 10^8$ cells/mL having an average cell size of 90 nm was added thereto. Then, after stirring for 30 hours while maintaining the temperature at 30° C., the obtained nanobubble-containing inorganic oxide fine particle dispersion was concentrated according to the method for measuring the concentration stability, and the concentration stability was evaluated. Furthermore, the quantification of impurities and the like were also performed. Table 1 shows the processing conditions and the measurement results.

Example 4

500 g of the ceria fine particle dispersion (solid concentration: 20 mass %) in which highly crystalline ceria fine particles having an average particle size of 250 nm were dispersed in water was prepared, and the temperature was maintained at 30° C. 500 g of the nanobubble aqueous solution containing $N_2$ of $12 \times 10^8$ cells/mL having an average cell size of 100 nm was added thereto. Then, after stirring for 50 hours while maintaining the temperature at 30° C., the obtained nanobubble-containing inorganic oxide fine particle dispersion was concentrated according to the method for measuring the concentration stability, and the concentration stability was evaluated. Furthermore, the quantification of impurities and the like were also performed. Table 1 shows the processing conditions and the measurement results.

Example 5

500 g of the ceria fine particle dispersion (solid concentration: 20 mass %) in which the ceria fine particles having an average particle size of 80 nm were dispersed in water was prepared, and the temperature was maintained at 30° C. 500 g of the nanobubble aqueous solution containing $N_2$ of $12 \times 10^8$ cells/mL having an average cell size of 250 nm was added thereto. Then, after stirring for 60 hours while maintaining the temperature at 30° C., the obtained nanobubble-containing inorganic oxide fine particle dispersion was concentrated according to the method for measuring the concentration stability, and the concentration stability was evaluated. Furthermore, as in Example 1, the remaining ratio of nanobubbles was obtained, and the quantification of impurities and the like were also performed. Table 1 shows the processing conditions and the measurement results.

Example 6

500 g of the ceria fine particle dispersion (solid concentration: 20 mass %) in which the ceria fine particles having an average particle size of 150 nm were dispersed in water was prepared, and the temperature was maintained at 30° C. 500 g of the nanobubble aqueous solution containing $H_2$ of $10 \times 10^8$ cells/mL having an average cell size of 300 nm was added thereto. Then, after stirring for 30 hours while maintaining the temperature at 30° C., the obtained nanobubble-containing inorganic oxide fine particle dispersion was concentrated according to the method for measuring the concentration stability, and the concentration stability was evaluated. Furthermore, the quantification of impurities and the like were also performed. Table 1 shows the processing conditions and the measurement results.

Example 7

500 g of the ceria fine particle dispersion (solid concentration: 20 mass %) in which the ceria fine particles having an average particle size of 20 nm were dispersed in water was prepared, and the temperature was maintained at 30° C. 500 g of the nanobubble aqueous solution containing $N_2$ of $15 \times 10^8$ cells/mL having an average cell size of 290 nm was added thereto. Then, after stirring for 60 hours while maintaining the temperature at 30° C., the obtained nanobubble-containing inorganic oxide fine particle dispersion was concentrated according to the method for measuring the concentration stability, and the concentration stability was evaluated. Furthermore, as in Example 1, the remaining ratio of nanobubbles was obtained, and the quantification of impurities and the like were also performed. Table 1 shows the processing conditions and the measurement results.

Reference Example 7

500 g of the silica fine particle dispersion (solid concentration: 30 mass %) in which the silica fine particles having an average particle size of 12 nm were dispersed in water was prepared, and the temperature was maintained at 20° C. 500 g of the nanobubble aqueous solution containing $N_2$ of $2.2 \times 10^8$ cells/mL having an average cell size of 150 nm was added thereto. Then, after stirring for 0.1 hours while maintaining the temperature at 95° C., the obtained solution was concentrated in the same manner as in Reference Example 1 according to the method for measuring the concentration stability. Furthermore, the quantification of impurities and the like were also performed. Table 1 shows the processing conditions and the results.

The filtration rate when the obtained nanobubble-containing inorganic oxide fine particle dispersion was filtered through the filtration filter (filter size: 0.5 µm) at a filtration pressure of 1 mPa in the same manner as in Reference Example 1 was 10 g/min. Regarding the nanobubble-containing inorganic oxide fine particle dispersion having passed through the filter, the number of coarse particles having a particle size of 0.51 µm or more was measured using the AccuSizer 780APS manufactured by PSS Inc. As a result, the number was 600,000 pieces/mL.

Reference Example 8

500 g of the silica fine particle dispersion (solid concentration: 30 mass %) in which the silica fine particles having an average particle size of 12 nm were dispersed in water was prepared, and the temperature was maintained at 20° C. 500 g of the nanobubble aqueous solution containing $N_2$ of $2 \times 10^4$ cells/mL having an average cell size of 1000 nm was added thereto. Then, after stirring for 2 hours while maintaining the same temperature, the obtained solution was concentrated in the same manner as in Reference Example 1 according to the method for measuring the concentration stability. Furthermore, the quantification of impurities and the like were also performed. Table 1 shows the processing conditions and the results.

Reference Example 9

500 g of the silica fine particle dispersion (solid concentration: 40 mass %) in which the silica fine particles having an average particle size of 80 nm were dispersed in water was prepared, and the temperature was maintained at 20° C. Then, without adding the nanobubble aqueous solution, the dispersion was concentrated in the same manner as in Reference Example 1 according to the method for measuring the concentration stability. Furthermore, the quantification of impurities and the like were also performed. Table 1 shows the processing conditions and the results.

Comparative Example 2

500 g of the silica ceria fine particle dispersion in which the silica ceria fine particles ($SiO_2/CeO_2$ mass ratio=50/50, solid concentration: 20 mass %) having an average particle size of 25 nm were dispersed in water was prepared, and the temperature was maintained at 20° C. Then, without adding the nanobubble aqueous solution, the dispersion was concentrated in the same manner as in Reference Example 1 according to the method for measuring the concentration stability. Furthermore, the quantification of impurities and the like were also performed. Table 1 shows the processing conditions and the results.

Reference Example 10

500 g of the silica zirconia fine particle dispersion in which the silica zirconia fine particles ($SiO_2/ZrO_2$ mass ratio=75/25, solid concentration: 20 mass %) having an average particle size of 20 nm were dispersed in water was prepared, and the temperature was maintained at 20° C. Then, without adding the nanobubble aqueous solution, the dispersion was concentrated in the same manner as in Reference Example 1 according to the method for measuring the concentration stability. Furthermore, the quantification of impurities and the like were also performed. Table 1 shows the processing conditions and the results.

Comparative Example 3

500 g of the ceria fine particle dispersion (solid concentration: 20 mass %) in which the ceria fine particles having an average particle size of 20 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 4

500 g of the ceria fine particle dispersion (solid concentration: 20 mass %) in which the ceria fine particles having an average particle size of 10 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 5

500 g of the ceria fine particle dispersion (solid concentration: 10 mass %) in which the ceria fine particles having an average particle size of 5 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 6

500 g of the ceria fine particle dispersion (solid concentration: 20 mass %) in which the highly crystalline ceria fine particles having an average particle size of 250 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 7

500 g of the silica ceria fine particle dispersion (solid concentration: 20 mass %) in which the silica ceria fine particles ($SiO_2/CeO_2$ mass ratio=50/50, solid concentration: 20 mass %) having an average particle size of 80 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 8

500 g of the silica ceria fine particle dispersion (solid concentration: 20 mass %) in which the silica ceria fine particles ($SiO_2/CeO_2$ mass ratio=50/50, solid concentration: 20 mass %) having an average particle size of 150 nm were dispersed in water was prepared, and the temperature was maintained at 20° C. Then, without adding the nanobubble aqueous solution, the dispersion was concentrated in the same manner as in Example 1 according to the method for measuring the concentration stability. Furthermore, the quantification of impurities and the like were also performed. Table 1 shows the processing conditions and the results.

Comparative Example 9

500 g of the ceria fine particle dispersion (solid concentration: 20 mass %) in which the ceria fine particles having an average particle size of 20 nm were dispersed in water was prepared, and the temperature was maintained at 20° C. 500 g of the nanobubble aqueous solution containing $N_2$ of $0.0002 \times 10^8$ cells/mL having an average cell size of 1000 nm was added thereto. Then, after stirring for 2 hours while maintaining the temperature at 95° C., the obtained solution was concentrated in the same manner as in Reference Example 1 according to the method for measuring the concentration stability. Furthermore, the quantification of impurities and the like were also performed. Table 1 shows the processing conditions and the results.

Impurity Ion Concentration Measurement

Examples

Ion-exchanged water was used as a dispersion medium (water) used in the inorganic oxide fine particle dispersions of Examples 1 to 7. Furthermore, regarding the nanobubble aqueous solution used in Examples, tap water was used as the dispersion medium (water). And results of having measured by the above method the concentration of chlorine ion, nitrate ion, or sulfate ion contained in the solution (nanobubble-containing inorganic oxide fine particle dispersion) obtained by the above process are shown in Table 1.

For Example 1, Example 2, Example 5 and Example 7, the solution (nanobubble-containing inorganic oxide fine particle dispersion) was stored at room temperature for 30 days, and results of concentration stability test are shown in Table 1.

Comparative Examples

Ion-exchanged water was used as the dispersion medium (water) used in Comparative Examples 2 to 10. Furthermore, regarding the nanobubble aqueous solution used in Comparative Examples, tap water was used as the dispersion medium (water).

For Comparative Examples 2 to 8 and Comparative Example 10, after adding a small amount of nitric acid aqueous solution (concentration: 10 mass %) to the solution (nanobubble-containing inorganic oxide fine particle dispersion) obtained in the above process, the concentration of chlorine ion, nitrate ion, or sulfate ion was measured by the above method. The results are shown in Table 1.

For Comparative Example 10, the solution (nanobubble-containing inorganic oxide fine particle dispersion) was stored at room temperature for 30 days, and the results of the concentration stability test are shown in Table 1.

For Comparative Example 9, after adding a small amount of hydrochloric acid aqueous solution (concentration: 10 mass %) to the above solution (nanobubble-containing inorganic oxide fine particle dispersion), the concentration of chlorine ion, nitrate ion, or sulfate ion was measured by the above method. The results are shown in Table 1.

TABLE 1

(Part 1)

| | Inorganic oxide particle dispersion | | | | | Nanobubble aqueous solution Gas component |
|---|---|---|---|---|---|---|
| | Inorganic oxide species | Ceria ratio in inorganic oxide fine particles (mass %) | Solid concentration (mass %) | Average particle size (nm) | Amount of use (g) | |
| Example 1 | Ceria fine particles | 100 | 20 | 20 | 500 | $N_2$ |
| Example 2 | Ceria fine particles | 100 | 20 | 10 | 500 | $N_2$ |
| Example 3 | Ceria fine particles | 100 | 10 | 5 | 500 | $H_2$ |
| Example 4 | Highly crystalline ceria fine particles | 100 | 20 | 250 | 500 | $N_2$ |
| Example 5 | Silica ceria fine particles | | 20 | 80 | 500 | $N_2$ |
| Example 6 | Silica ceria fine particles | | 20 | 150 | 500 | $H_2$ |
| Example 7 | Ceria fine particles | 100 | 20 | 20 | 500 | $N_2$ |
| Comparative Example 1 | Silica ceria sol | 50 | 20 | 25 | 500 | $O_2$ |
| Comparative Example 2 | Silica ceria fine particles | 50 | 20 | 25 | 500 | None |
| Comparative Example 3 | Ceria fine particles | 100 | 20 | 20 | 500 | None |
| Comparative Example 4 | Ceria fine particles | 100 | 20 | 10 | 500 | None |
| Comparative Example 5 | Ceria fine particles | 100 | 10 | 5 | 500 | None |
| Comparative Example 6 | Highly crystalline ceria fine particles | 100 | 20 | 250 | 500 | None |
| Comparative Example 7 | Silica ceria fine particles | 50 | 20 | 80 | 500 | None |
| Comparative Example 8 | Silica ceria fine particles | 50 | 20 | 150 | 500 | None |
| Comparative Example 9 | Ceria fine particles | 100 | 20 | 20 | 500 | $N_2$ |
| Comparative Example 10 | Ceria fine particles | 100 | 20 | 20 | 500 | $N_2$ |
| Reference Example 1 | Silica fine particles | 0 | 5 | 3 | 500 | $N_2$ |

TABLE 1-continued (Part 1)

| | | | | | | |
|---|---|---|---|---|---|---|
| Reference Example 2 | Silica fine particles | 0 | 40 | 80 | 500 | $N_2$ |
| Reference Example 3 | Silica fine particles | 0 | 30 | 12 | 500 | $N_2$ |
| Reference Example 4 | Silica fine particles | 0 | 20 | 5 | 500 | $N_2$ |
| Reference Example 5 | Silica fine particles | 0 | 48 | 250 | 500 | $N_2$ |
| Reference Example 6 | Silica zirconia sol | 0 | 20 | 20 | 500 | $N_2$ |
| Reference Example 7 | Silica fine particles | 0 | 30 | 12 | 500 | $N_2$ |
| Reference Example 8 | Silica fine particles | 0 | 30 | 12 | 500 | $N_2$ |
| Reference Example 9 | Silica fine particles | 0 | 40 | 80 | 500 | None |

| | Nanobubble aqueous solution | | | | | |
|---|---|---|---|---|---|---|
| | Average cell size (nm) | Cells/mL (×10⁸) | Amount of use (g) | Preparation method*1 | Reaction time (Hr) | Temperature (° C.) |
| Example 1 | 290 | 15 | 500 | A | 60 | 30 |
| Example 2 | 90 | 15 | 500 | A | 40 | 30 |
| Example 3 | 90 | 10 | 500 | A | 30 | 30 |
| Example 4 | 100 | 12 | 500 | A | 50 | 30 |
| Example 5 | 250 | 12 | 500 | A | 60 | 30 |
| Example 6 | 300 | 10 | 500 | A | 30 | 30 |
| Example 7 | 290 | 15 | 500 | A | 60 | 30 |
| Comparative Example 1 | 300 | 1.0 | 500 | B | 24 | 20 |
| Comparative Example 2 | | | | | | |
| Comparative Example 3 | | | | | | |
| Comparative Example 4 | | | | | | |
| Comparative Example 5 | | | | | | |
| Comparative Example 6 | | | | | | |
| Comparative Example 7 | | | | | | |
| Comparative Example 8 | | | | | | |
| Comparative Example 9 | 1000 | 0.0002 | 500 | A | 2 | 95 |
| Comparative Example 10 | 290 | 15 | 500 | A | 60 | 30 |
| Reference Example 1 | 200 | 1.1 | 500 | A | 1 | 20 |
| Reference Example 2 | 180 | 1.1 | 500 | A | 2 | 20 |
| Reference Example 3 | 150 | 2.2 | 500 | A | 2 | 20 |
| Reference Example 4 | 293 | 2.0 | 500 | A | 2 | 20 |
| Reference Example 5 | 80 | 5.0 | 500 | A | 1.5 | 5 |
| Reference Example 6 | 70 | 2.0 | 500 | A | 2 | 10 |
| Reference Example 7 | 150 | 2.2 | 500 | A | 0.1 | 20 |
| Reference Example 8 | 1000 | 0.0002 | 500 | A | 2 | 95 |
| Reference Example 9 | | | | | | |

*1 Nanobubble preparation method: A is a post-addditon method, and B is a method of adjusting in an inoranic oxide solution

TABLE 1

(Part 2)

Nanobubble-containing inorganic oxide fine particle dispersion

| | Solid concentration (mass %)*2 | V1 | V2 | ΔV (PCD) at PH 4.5 | Initial concentration stability (mass %) | Concentration stability after 30 days (mass %) | Chlorine ion content (mol/m$^2$) | Nitrate ion content (mol/m$^2$) | Sulfate ion content (mol/m$^2$) | Remaining ratio of nanobubble after 30 days |
|---|---|---|---|---|---|---|---|---|---|---|
| Example 1 | 10 | −50 | −110 | 60 | 40 | 38 | Not detected | $4 \times 10^{-7}$ | Not detected | 92 |
| Example 2 | 10 | −40 | −81 | 41 | 32 | 30 | $2 \times 10^{-9}$ | Not detected | Not detected | 95 |
| Example 3 | 5 | −35 | −60 | 25 | 18 | — | Not detected | Not detected | $2 \times 10^{-8}$ | — |
| Example 4 | 10 | −65 | −185 | 120 | 52 | — | Not detected | $4 \times 10^{-10}$ | Not detected | — |
| Example 5 | 10 | −220 | −262 | 42 | 43 | 41 | Not detected | $1 \times 10^{-7}$ | Not detected | 92 |
| Example 6 | 10 | −220 | −279 | 59 | 45 | — | Not detected | $1 \times 10^{-7}$ | Not detected | — |
| Example 7 | 10 | −50 | −100 | 50 | 41 | 38 | Not detected | Not detected | $5 \times 10^{-8}$ | 93 |
| Comparative Example 1 | 10 | | | | 30 | — | — | — | — | — |
| Comparative Example 2 | — | −220 | −229 | 9 | 23 | — | Not detected | $1 \times 10^{-4}$ | Not detected | — |
| Comparative Example 3 | — | −50 | — | — | 34 | — | Not detected | $4 \times 10^{-4}$ | Not detected | — |
| Comparative Example 4 | — | −30 | — | — | 16 | — | Not detected | $1 \times 10^{-4}$ | Not detected | — |
| Comparative Example 5 | — | −10 | — | — | 10 | — | Not detected | $4 \times 10^{-4}$ | Not detected | — |
| Comparative Example 6 | — | −65 | — | — | 46 | — | Not detected | $3 \times 10^{-4}$ | Not detected | — |
| Comparative Example 7 | — | −220 | — | — | 36 | — | Not detected | $1 \times 10^{-4}$ | Not detected | — |
| Comparative Example 8 | — | −220 | — | — | 35 | — | Not detected | $1 \times 10^{-5}$ | Not detected | — |
| Comparative Example 9 | 10 | −50 | −52 | 2 | 34 | — | $4 \times 10^{-4}$ | Not detected | Not detected | — |
| Comparative Example 10 | 10 | −50 | −55 | 5 | 31 | 29 | Not detected | $30 \times 10^{-2}$ | Not detected | 15 |
| Reference Example 1 | 2.5 | — | — | — | 7 | — | — | — | — | — |
| Reference Example 2 | 20 | — | — | — | 54 | — | — | — | — | — |
| Reference Example 3 | 15 | — | — | — | 41 | — | — | — | — | — |
| Reference Example 4 | 2.5 | — | — | — | 25 | — | — | — | — | — |
| Reference Example 5 | 24 | — | — | — | 56 | — | — | — | — | — |
| Reference Example 6 | 10 | — | — | — | 31 | — | — | — | — | — |
| Reference Example 7 | 15 | — | — | — | 34 | — | — | — | — | — |
| Reference Example 8 | 15 | — | — | — | 35 | — | — | — | — | — |
| Reference Example 9 | — | — | — | — | 47 | — | — | — | — | — |

*2Since Comparative Examples 2 to 8 and Reference Examples 9 and 10 are inorganic oxide fine particle dispersions not containing nanobubbles, display in this column is "—"

The concentration stability has a correlation with the particle size (average particle size) of the inorganic oxide fine particles in the case of the same kind of inorganic oxide. Therefore, a relationship between the average particle size and the concentration stability is shown in a graph (FIG. 1).

Figure 1:
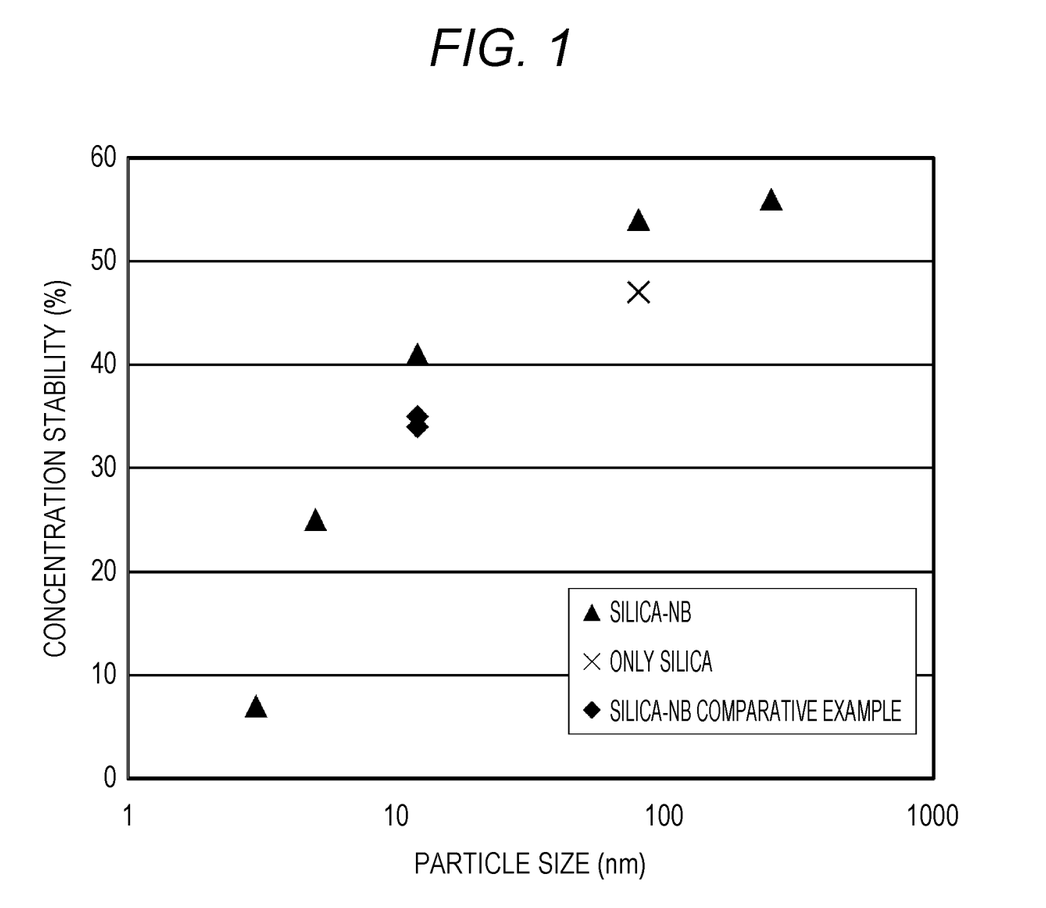
FIG. 1 is a graph showing concentration stability in Examples and Comparative Examples.
Figure 2:
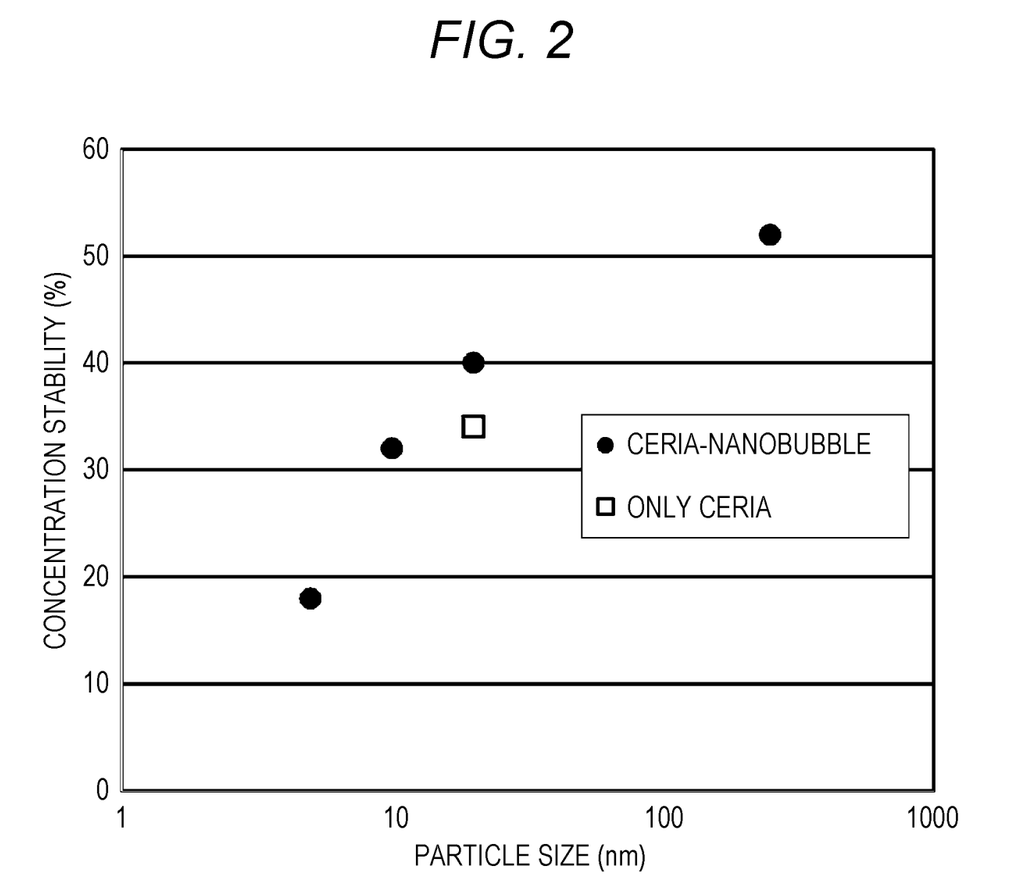
FIG. 2 is another graph showing concentration stability in Examples and Comparative Examples.
Figure 3:
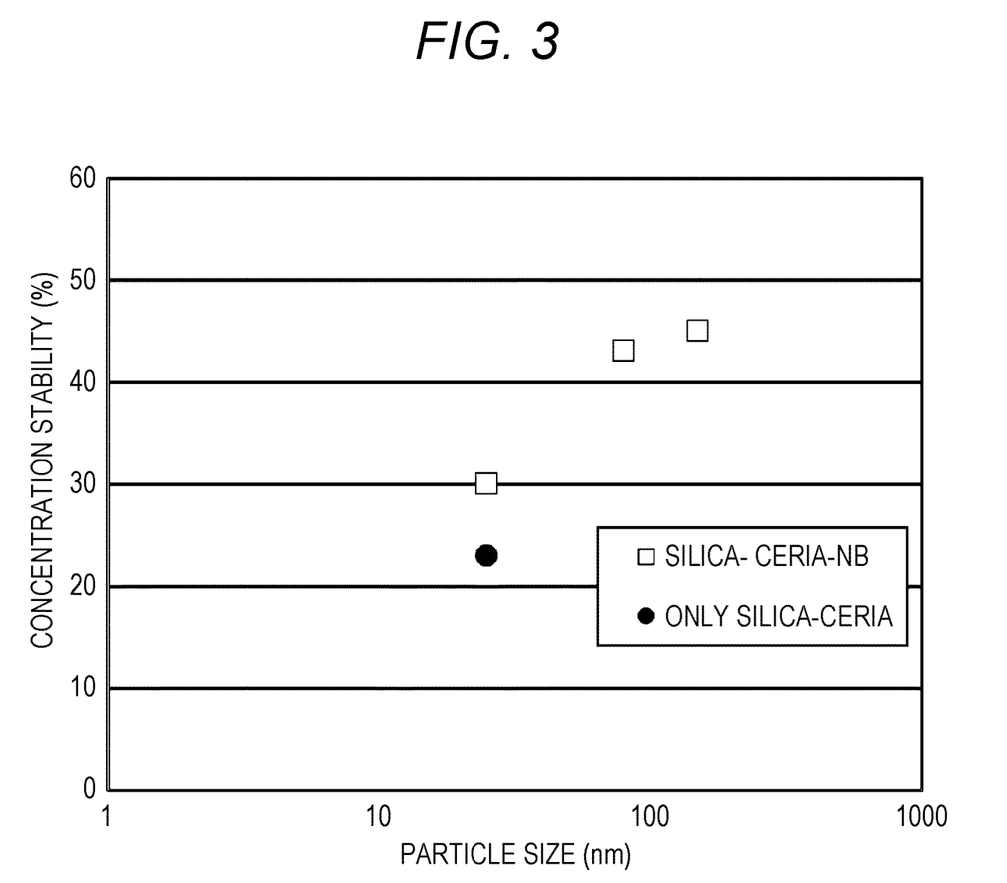
FIG. 3 is still another graph showing concentration stability in Examples and Comparative Examples.

From the graph of FIG. 1, for example, in the case of Reference Example 3, it can be seen that the concentration stability is superior to Reference Example 7 or Reference Example 8 having the same average particle size of the silica fine particles. It can also be seen that Reference Example 2 is superior in concentration stability as compared to Reference Example 9 having the same average particle size of the silica fine particles.

On the other hand, it was found that if a stirring time of the inorganic oxide fine particle dispersion and the nanobubble aqueous solution is short as in Reference Example 7, or the solution temperature during stirring is high as in Reference Example 8, the concentration stability deteriorates. It was also found that the concentration stability deteriorates when the nanobubble aqueous solution is not used as in Reference Example 9. Note that the fact that these effects according to the present invention are expressed in the same manner in the dispersions of the inorganic oxide fine particles other than the silica fine particles, although there is a difference in degree, is shown in Comparative Example 1 and Comparative Example 2, Reference Example 4 and Reference Example 10, and Example 1 and Comparative Example 3.

The invention claimed is:

1. A nanobubble-containing inorganic oxide fine particle dispersion comprising:
   inorganic oxide fine particles having an average particle size of 1 to 500 nm and containing Ce; and
   at least $10^5$ cells/mL nanobubbles having an average cell size of 250 to 500 nm and being at least one non-oxidizing gas selected from a group consisting of $N_2$ and $H_2$.

2. The nanobubble-containing inorganic oxide fine particle dispersion according to claim 1, wherein if streaming potential when solid concentration is 0.005 mass % and pH is adjusted to 4.5 is taken as V2 [mV], and if the streaming potential when the nanobubbles are removed, the solid concentration is 0.005 mass %, and the pH is adjusted to 4.5 is taken as V1 [mV], a streaming potential difference $\Delta V = V1 - V2$ is at least 10 mV.

3. The nanobubble-containing inorganic oxide fine particle dispersion according to claim 1, wherein the inorganic oxide fine particles are silica ceria composite fine particles.

4. The nanobubble-containing inorganic oxide fine particle dispersion according to claim 3, wherein ceria content in the silica ceria composite particles is at least 10 mass %.

5. The nanobubble-containing inorganic oxide fine particle dispersion according to claim 1, wherein content of monovalent anions to a total surface area ($4\pi r^2 N$) obtained from the average cell size (r) and the average number of cells (N) of the nanobubbles, assuming that the nanobubbles are spheres, is less than $8.8 \times 10^{-6}$ mol/m$^2$.

6. The nanobubble-containing inorganic oxide fine particle dispersion according to claim 1, wherein content of divalent anions to a total surface area ($4\pi r^2 N$) obtained from the average cell size (r) and the average number of cells (N) of the nanobubbles, assuming that the nanobubbles are spheres, is less than $4.4 \times 10^{-6}$ mol/m$^2$.

7. An abrasive comprising the nanobubble-containing inorganic oxide fine particle dispersion according to claim 1.

8. The nanobubble-containing inorganic oxide fine particle dispersion according to claim 1, wherein the nanobubbles comprises $H_2$.

9. A nanobubble-containing inorganic oxide fine particle dispersion comprising:
   inorganic oxide fine particles having an average particle size of 1 to 500 nm and containing Ce; and
   at least $10^5$ cells/mL nanobubbles having an average cell size of 250 to 500 nm and comprising $H_2$.

10. An abrasive comprising the nanobubble-containing inorganic oxide fine particle dispersion according to claim 9.

* * * * *